(12) United States Patent
Mudd et al.

(10) Patent No.: US 10,497,542 B2
(45) Date of Patent: Dec. 3, 2019

(54) FLOW CONTROL SHOWERHEAD WITH INTEGRATED FLOW RESTRICTORS FOR IMPROVED GAS DELIVERY TO A SEMICONDUCTOR PROCESS

(71) Applicants: Daniel T. Mudd, Reno, NV (US); Patti J Mudd, Reno, NV (US)

(72) Inventors: Daniel T. Mudd, Reno, NV (US); Patti J Mudd, Reno, NV (US)

( * ) Notice: Subject to any disclaimer, the term of this patent is extended or adjusted under 35 U.S.C. 154(b) by 320 days.

(21) Appl. No.: 15/394,809

(22) Filed: Dec. 30, 2016

(65) Prior Publication Data

US 2017/0194172 A1   Jul. 6, 2017

Related U.S. Application Data

(60) Provisional application No. 62/387,800, filed on Jan. 4, 2016.

(51) Int. Cl.
*B05B 1/30* (2006.01)
*H01J 37/32* (2006.01)

(52) U.S. Cl.
CPC ............ *H01J 37/3244* (2013.01); *B05B 1/30* (2013.01)

(58) Field of Classification Search
CPC .. H01L 21/67; B05B 1/30; B05B 7/04; B05B 15/00
See application file for complete search history.

(56) References Cited

U.S. PATENT DOCUMENTS

| | | | |
|---|---|---|---|
| 6,086,677 A * | 7/2000 | Umotoy | C23C 16/45514 118/715 |
| 6,983,892 B2 * | 1/2006 | Noorbakhsh | C23C 16/45565 239/553.3 |
| 7,059,363 B2 | 6/2006 | Sugiyama et al. | |
| 7,219,533 B2 | 5/2007 | Ohmi et al. | |
| 7,431,045 B2 | 10/2008 | Mudd et al. | |
| 8,376,312 B2 | 2/2013 | Mudd et al. | |
| 8,496,022 B2 | 7/2013 | Sugiyama et al. | |
| 9,098,082 B2 | 8/2015 | Sugiyama et al. | |

(Continued)

OTHER PUBLICATIONS

Xia, Huanxiong Xia, et al., "Simulation-Based Optimization of a Vector Showerhead System for the Control of Flow Field Profile in a Vertical Reactor Chamber". Advances in Mechanical Engineering, vol. 2014, Article ID 525102, 9 pages.*

(Continued)

*Primary Examiner* — Bret P Chen
(74) *Attorney, Agent, or Firm* — Law Office of Dorian Cartwright; Dorian Cartwright

(57) ABSTRACT

A gas flow control showerhead with integrated characterized restrictions for a gas delivery system. An input distribution disk with a plurality of inputs is fluidly coupled to a plurality of conduits each conduit exhausting a process gas to the input distribution disk from a controllable pressure regulator in a gas box. A plurality of restriction flow paths is formed by one or more stacked triples of plenum disks, restriction disks, and outlet diffuser disks that are grouped with each group providing a pressure drop used in control of a mass flow rate of a process gas. Each outlet diffuser disk having a plurality of outputs distributed around different locations of the outlet diffuser disks exhausting the process gases for application to a wafer being processed within a process chamber at designated mass flow rates.

19 Claims, 12 Drawing Sheets

(56) References Cited

U.S. PATENT DOCUMENTS

| | | | | |
|---|---|---|---|---|
| 10,217,614 B2* | 2/2019 | Tucker | ................ | H01J 37/3244 |
| 2002/0092471 A1* | 7/2002 | Kang | .................... | C23C 16/455 |
| | | | | 118/715 |
| 2006/0021703 A1* | 2/2006 | Umotoy | ............ | C23C 16/45565 |
| | | | | 156/345.34 |
| 2012/0305190 A1* | 12/2012 | Kang | .................... | H01J 37/321 |
| | | | | 156/345.34 |
| 2014/0033828 A1* | 2/2014 | Larson | ...................... | G01F 1/36 |
| | | | | 73/861.61 |
| 2014/0103145 A1* | 4/2014 | White | .............. | H01J 37/32449 |
| | | | | 239/548 |
| 2014/0235069 A1* | 8/2014 | Breiling | ................... | F28F 3/02 |
| | | | | 438/778 |

OTHER PUBLICATIONS

Rader, Daniel J., et al., "Showerhead-Enhanced Inertial Particle Deposition in Parallel-Plate Reactors". Aerosol Science and Technology, 28:2, 105-132, (1998). DOI: 10.1080/02786829808965515.*

Nijhawan, Sandeep, et al., "Particle transport in a parallel-plate semiconductor reactor: Chamber modification and design criterion for enhanced process cleanliness". J. Vac. Sci. Technol. A 18(5), Sep./Oct. 2000, pp. 2198-2206.*

\* cited by examiner

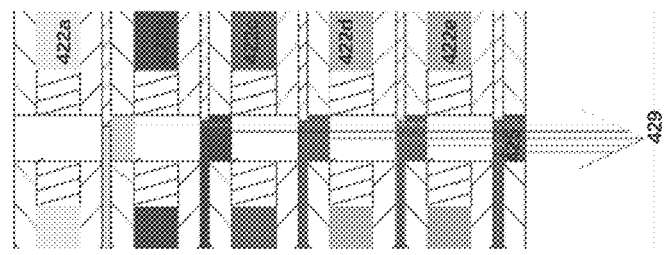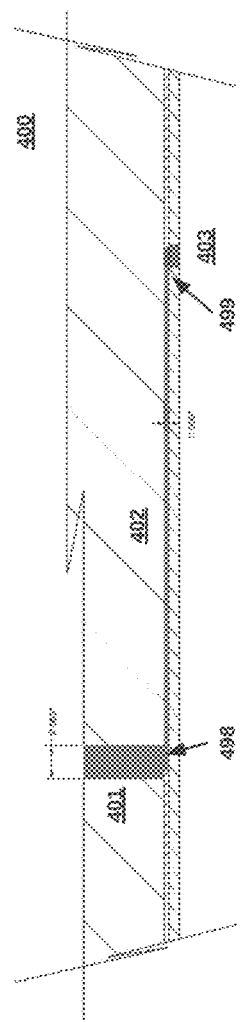
*FIG. 4A*
*FIG. 4B*
*FIG. 4C*

US 10,497,542 B2

FLOW CONTROL SHOWERHEAD WITH INTEGRATED FLOW RESTRICTORS FOR IMPROVED GAS DELIVERY TO A SEMICONDUCTOR PROCESS

CROSS-REFERENCE TO RELATED APPLICATIONS

This application claims the benefit of priority under 35 U.S.C. 119(e) to U.S. Application No. 62/387,800, filed Jan. 4, 2016, by Daniel T. Mudd et al., the contents of which are hereby incorporated by reference in its entirety.

FIELD OF THE INVENTION

The invention relates generally to semiconductor processing, and more specifically, a semiconductor fabrication tool showerhead with localized, integrated characterized flow restrictions.

BACKGROUND

Gas flow measurement, control and distribution has long been a critical subsystem in the manufacture of semiconductor devices. This subsystem, along with the RF power and the pressure control are the three major subsystems of a modern semiconductor fabrication tool. As the processes in the fabrication of integrated circuits, are chemical and/or physical reactions, the amount and specific chemistry present at the wafer surface defines the quality of the product. To have a repeatable quality outcome one needs repeatable and uniform chemistry over the wafer surface.

In addition, as smaller device geometries evolve in support of Moore's Law, the process time becomes shorter resulting in tighter tolerances. As such, the transition time for the changing of gas species delivered to the wafer becomes more important. Flow measurement and control farther from the wafer induces transport time, unknown resistances, and other issues that consume error budgets when changing from one species to another or from one gas mixture to another gas mixture.

FIG. 1 illustrates a gas handling system 100 of a typical modern semiconductor fabrication tool. Of note is the gas mass flow measurement and control function performed by thermal or pressure based MFCs (mass flow controllers) 111 located remote from a conventional showerhead 125 and wafer 126. Gas exiting a flow controlling gas box 110 typically travels through one or more feed conduits 199 to the process chamber 120 where it exhausts into one or more sealed spaces within the showerhead, collectively referred to as the plenum or plenums, and from there outward through a plurality of showerhead discharge holes.

The conventional showerhead 125 is shown in more detail in FIGS. 2A and 2B. As illustrated there, the conventional showerhead 125 typically contains more than 1,000 desirably identical small discharge holes in a pattern as shown in FIG. 2A and has cross section characteristics similar to those shown in FIG. 2B. The holes have moderate flow resistance so that uniform pressure builds up in the plenum due to its relatively large characteristic dimension resulting in its flow resistance being insignificant compared to that of the small discharge holes. The plenum pressure is on the order of magnitude of 10 torr at typical process flows for some tools. The discharge hole pattern shown in FIG. 2A is on a wafer side of the conventional showerhead 125 while FIG. 2B shows a discharge hole cross section. It is noted that a larger (e.g. 0.040") drill is used for a portion of the discharge hole to allow easier manufacturing by reducing the length to diameter ratio of the drill. The majority of the pressure drop occurs through the smaller (e.g. 0.025") drilled portion. Both drilled holes are small enough to create a dark zone that prevents RF power from creating a plasma and disassociating the gas molecules in the showerhead plenum prior to exiting the conventional showerhead 125.

Pressure based flow measurement and control has shown superior flow measurement and control compared to the earlier use of thermal based flow controllers. The pressure based devices rely on the concept that if the flow rate of a gas is characterized through a known flow path, as a function of the temperature and upstream and downstream pressures experienced by the flow path during a calibration process, this characterization can be used to measure and control gas flow in manufacturing processes by recreating the upstream pressures and measuring the current temperature and downstream pressure. Hardware for this gas control function is typically contained in a single device for each gas species utilizing a pressure based MFC or similar hardware on a gas stick in the gas box. MFCs are normally used to turn on, turn off, and control process gas flows at a desired flow rate.

However, commercially available MFCs are slow to transition between gases or to transition from higher flow rates to lower flow rates of a single gas. Of particular interest are low flow rate MFCs which experience slug flow delays associated with displacing gases in their branch legs before being carried to the process chamber by a higher flow carrier gas when their branch leg joins with the process gas header carrying all the gases. When the gasses first turn on the higher flow carrier gas pressurizes a section of the low flow gases branch. In addition, the pressurization for the process header requires a mass of gas that also introduces a pressurization delay. In addition, for some gases, NH3 and others, gas absorption or desorption to the tubing walls can affect the amount of a gas delivered to the chamber as molecules can attach themselves or release from the walls of the tubing carrying the gas. As such disposition of the gas mixture within the showerhead plenum is indeterminate, thus making for uncertainty about process conditions near the wafer.

Therefore, what is needed is a robust showerhead to integrate flow restriction for controlling mass flow of process gas to reduce transition times of the gas changes at the wafer, and improve control and knowledge of conditions near the wafer, in semiconductor tools in a manner that conserves error budgets.

SUMMARY OF THE DISCLOSURE

The above-mentioned shortcomings are addressed by systems, methods, and non-transitory source code for a gas flow control showerhead with integrated flow restriction.

In an embodiment, an input distribution disk with a plurality of inlets is fluidly coupled to one or more conduits exhausting a process gas (e.g., a single gas or a mixture) being sent for exposure to a wafer. A plurality of restriction flow paths is formed by a stack of plenum disks and restriction disk combinations that are paired to enable control of mass flow rate of the plurality of process gases with impedance. An outlet diffuser disk with a plurality of outlet holes distributed around different locations of the outlet diffuser disk exhausts the process gas (or mixture) for application to the wafer being processed within a process chamber at a designated mass flow rate.

In another embodiment, a first restriction path of the plurality of restriction paths comprises a first conduit portion of a vertical inlet defined by spacing between the input distribution disk and a first plenum disk, a second conduit portion within a plenum defined by horizontal partial etching of the first plenum disk, a third conduit portion defined by spacing between the plenum disk and a first restriction disk (e.g., thickness of the first restriction disk), and a fourth conduit portion of a restriction channel defined by a partial etching into the first restriction disk, and a fifth conduit portion of a vertical outlet defined by spacing between the restriction disk and the outlet diffuser disk (e.g., thickness of the outlet diffuser disk).

In still another embodiment, a characteristic dimension (e.g., effective hydraulic diameter) of the restriction channel is small relative to a characteristic dimension of an inlet and a characteristic dimension of an outlet of the restriction channel, a ratio between the restriction channel characteristic dimension and those of the inlet and outlet generating an impedance causing a pressure drop used to control the mass flow rate of the process gas.

Advantageously, locating the gas flow measurement and control closer to a wafer improves transition times thereby conserving error budgets, especially in low flow processes. Combining this function with the gas distribution function provides a more efficient semiconductor process and similar products that use processes tangent to IC fabrication such as Solar and MEMs devices.

BRIEF DESCRIPTION OF THE DRAWINGS

In the following drawings, like reference numbers are used to refer to like elements. Although the following figures depict various examples of the invention, the invention is not limited to the examples depicted in the figures.

FIGS. 4A-4E are cross-section views illustrating the gas flow control showerhead with integrated flow restriction of the gas delivery system of FIG. 3 in more detail, according to an embodiment.

DETAILED DESCRIPTION

The disclosure provides gas delivery apparatus, gas delivery methods, non-transitory source code for a gas flow control showerhead with integrated flow restriction. Multiple characterized flow paths can be applied to maximize coverage to a wafer surface in a semiconductor process. Besides a semiconductor process, the disclosed techniques can be implemented in any environment using low flows of gas or fluid with tight tolerance limits.

Figure 1:
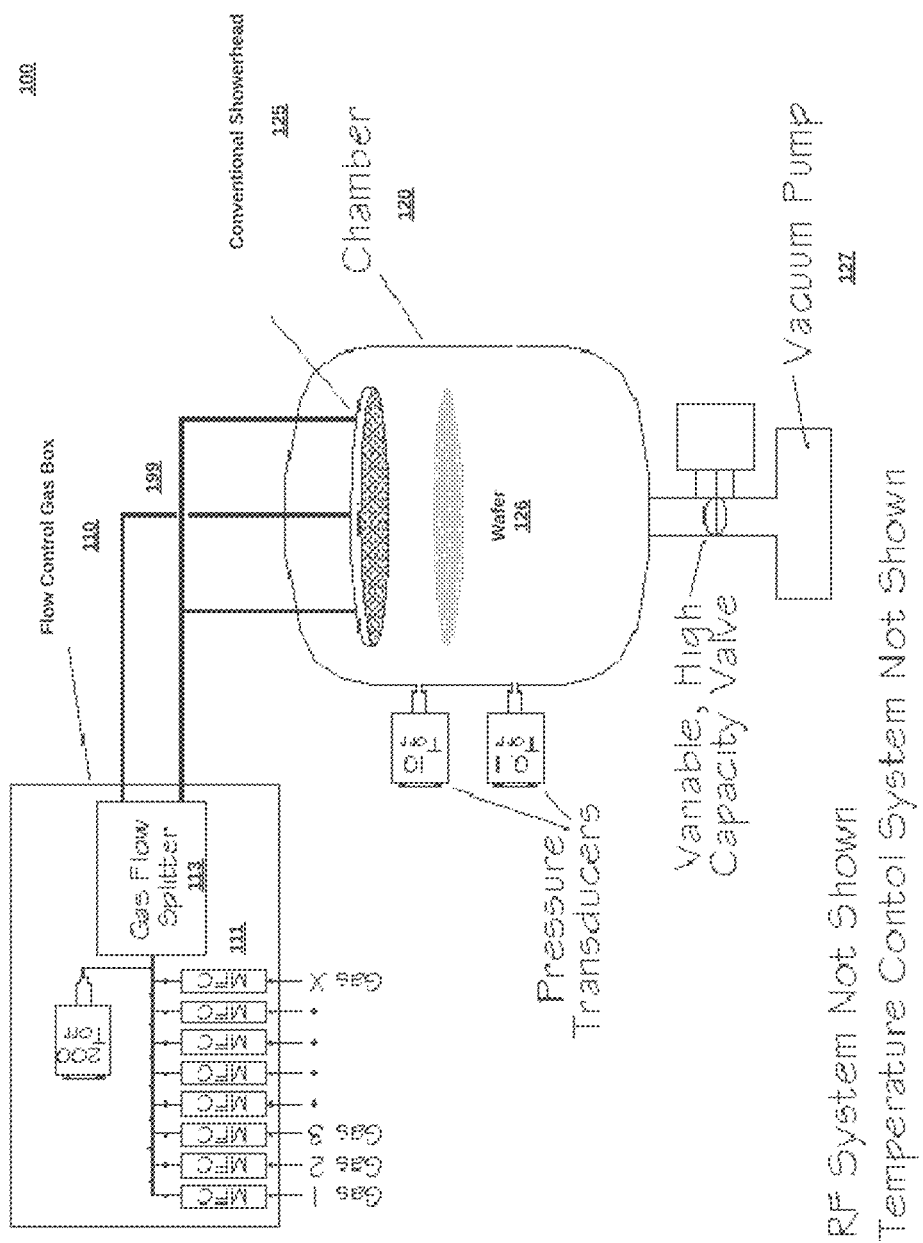
FIG. 1 is a perspective diagram illustrating a gas delivery system having a conventional showerhead, according to the prior art.
Figure 2A:
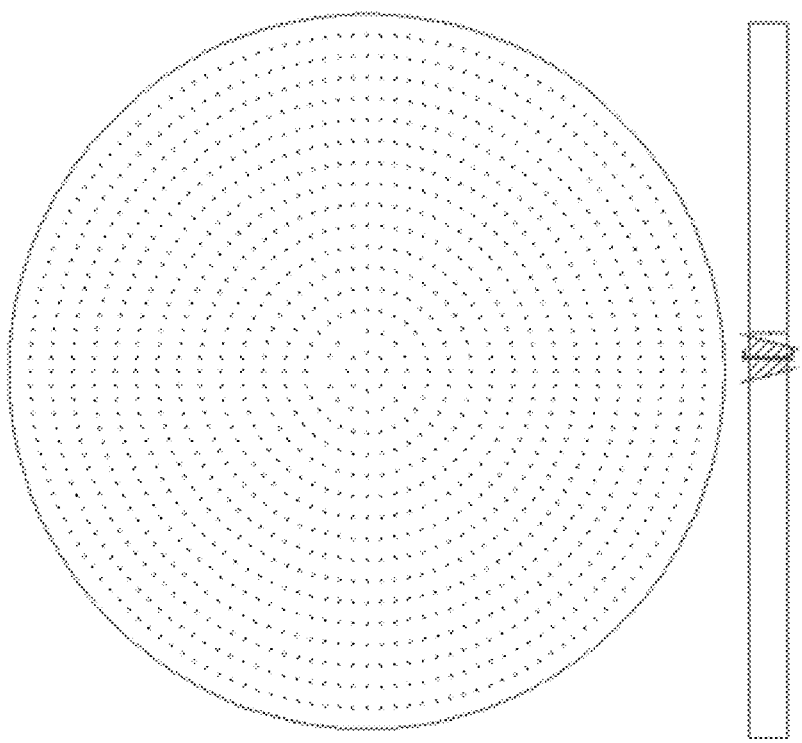
FIG. 2A-2B are a perspective diagram illustrating a conventional showerhead of the gas delivery system in FIG. 1, according to the prior art.
Figure 2B:
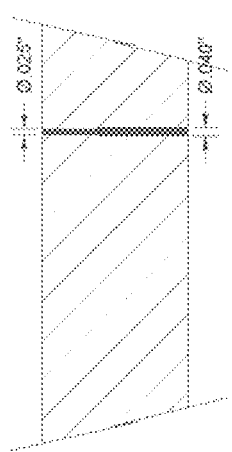
Figure 3:
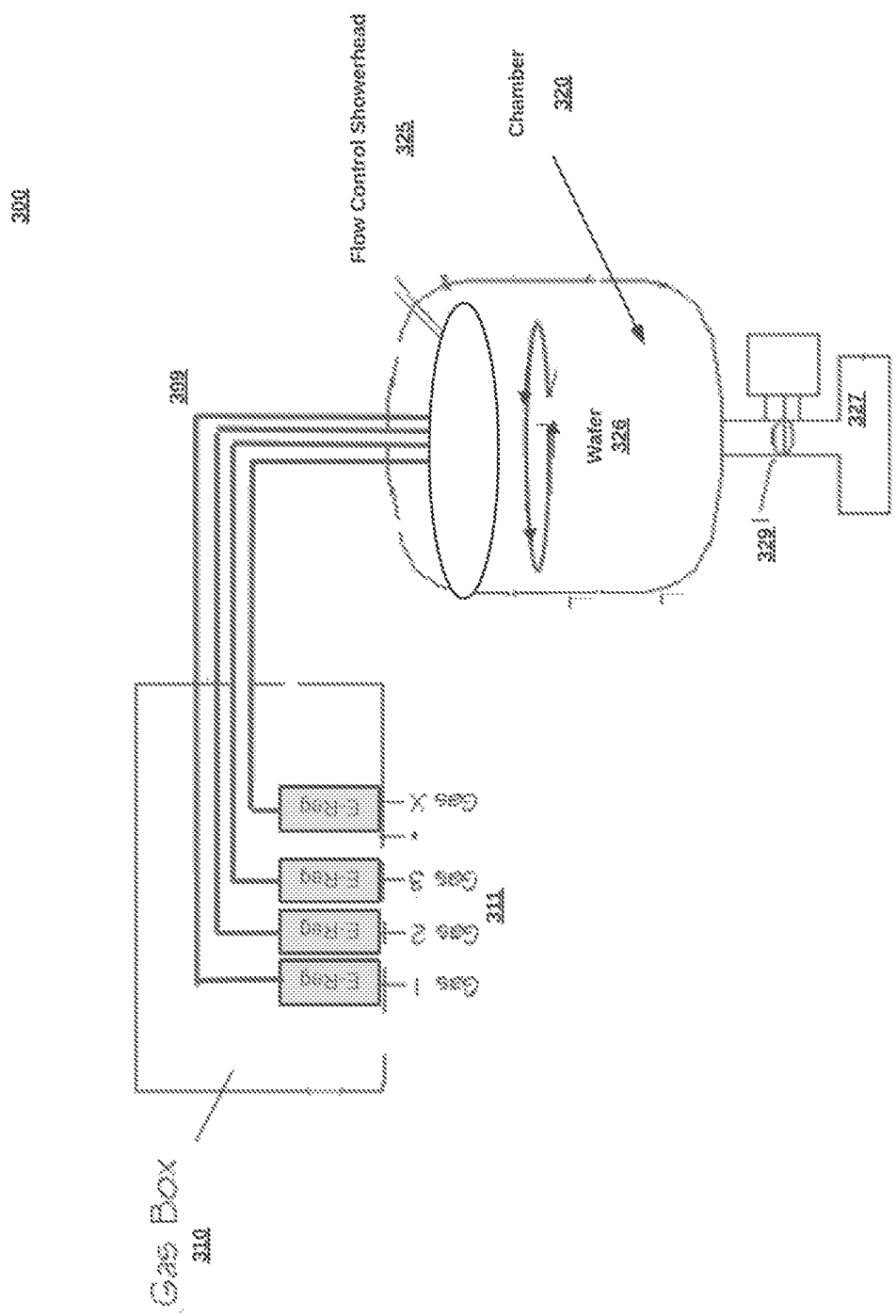
FIG. 3 is a perspective diagram illustrating a gas delivery system having a gas flow control showerhead with integrated flow restriction, according to an embodiment.

FIG. 3 is a perspective diagram illustrating a gas delivery system 300 having an exemplary gas flow control showerhead 325 with integrated flow restriction, according to an embodiment. The gas delivery system 300 comprises a gas box 310 and a process chamber 320 housing the gas flow control showerhead 325 and a wafer 326. Relative to the prior art gas delivery system 100 of FIGS. 1 and 2A-2B, localized flow restriction at the gas flow control showerhead 325 reduces transition times when changing a gas mixture flow rate, or composition, or both. Specific embodiment details of the exemplary gas flow control showerhead 325 are shown in FIGS. 4 and 5. The gas delivery system 300 can be, for example, a new 300 mm tool, a retrofit 200 mm tool, or an LED tool. One of ordinary skill in the art will recognize other possible embodiments.

Regarding FIG. 3, a flow path for gas starts with homogeneous gas sources entering inputs 311 of the gas box 310 which uses e-regulators 311 to exhaust pressurize gases prescribed for a particular semiconductor process. Feed conduits 399 connect the gas box 310 to the chamber 320 for transporting the one or more gases downstream for application to the wafer 326. After application to the wafer 326, the remaining gas mixture is evacuated from the chamber 320 through a vacuum pump 327. The gas sources can include process gases or carrier gases such as N2, O2, SF6, C4F8 and the like.

The gas box 310, operatively connected to the gas flow control showerhead 325, includes electronically commandable pressure regulators (e-regulators) 311, and a controller (not shown). The major elements of the previously described pressure based mass flow controllers (e.g. MFCs 111 in the gas system 100 of a typical tool) are separated. The pressure adjusting element is embodied as an e-regulator 311, the known and characterized flow path is predominantly within the gas flow control showerhead 325, while the upstream pressure is detected and the current gas temperature measured adjacent or within the gas flow control showerhead 325. The E-regulators 311 under direction of a local or remote computerized controller, control a specific gas mixture from individual gas inputs, based on mass flow set points. Pressure transducers to feedback pressure to the e-regulators 311 can be located within the gas box 310, or remotely at the flow control showerhead 325, so long as pressure measurements adequately represent pressure at the inlet of the highly restrictive flow passages in the flow control showerhead 325. When located remotely, error budget consumed by resistance in the conduits 399 is conserved.

In more detail, a controller may receive pressure set points associated with a desired mass flow, but more often the controller directly receives a mass flow set point and calculates the needed pressure to deliver the desired mass flow, in some embodiments, and then calculate adjustments based on pressure measurements from pressure transducers. To do so, feed conduits 399 are quickly pressurized to a target pressure to affect flow through the flow restrictions of the flow control showerhead 325. Initially, during pressurization to the needed pressure to result in the desired mass flow through the characterized restrictions in the showerhead, the mass flow rate though the control valve of the e-regulator is markedly larger than the desired mass flow, however, since the pressure is not to target the flow out of the showerhead will be lower than the target. As the needed pressure is achieved, the flow rate though the e-regulator and the flow out of the showerhead will become equal to the target flow. This controlling based off of the needed P1 pressure as opposed to the steady state conduit filling by MFCs achieves the pressurization of the conduits quicker and hence achieve the desired flow at the wafer quicker. Alternatively, the controller may receive mass flow set points, in some embodiments, and provide associated pressure set points to the e-regulators 311 in consideration of the current gas temperature.

The e-regulators 311 maintain closed loop control of the conduit pressurization in response to feedback signals from pressure transducers coupled adjacent or within the gas flow control showerhead 325. Pressure may be periodically measured and corresponding mass flow determined and fed back to the controller, or another portion of the tool, or an external central computer for adjustments. In one embodiment, pressure is fed back from a pressure transducer 460 tapped into a plenum disk, and in other embodiments, at a gas inlet 462 to the plenum disk. Set points can be received from an external central computer or be input directly from an operator or an automated process. The controller can include hardware and/or software implemented with an onboard processor. In one embodiment, the controller may be located external to the gas box 310.

Figure 4D:
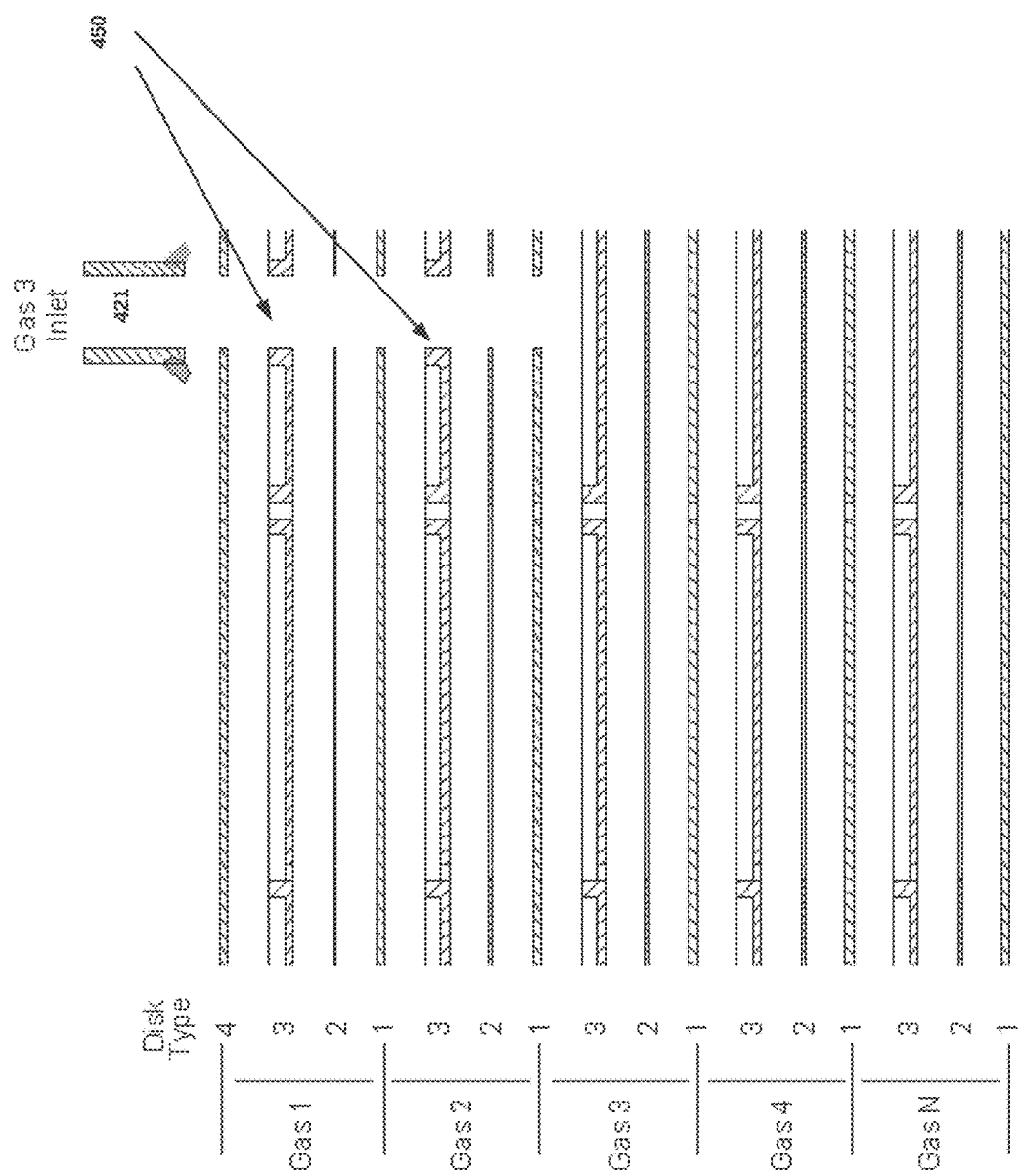
Figure 4E:
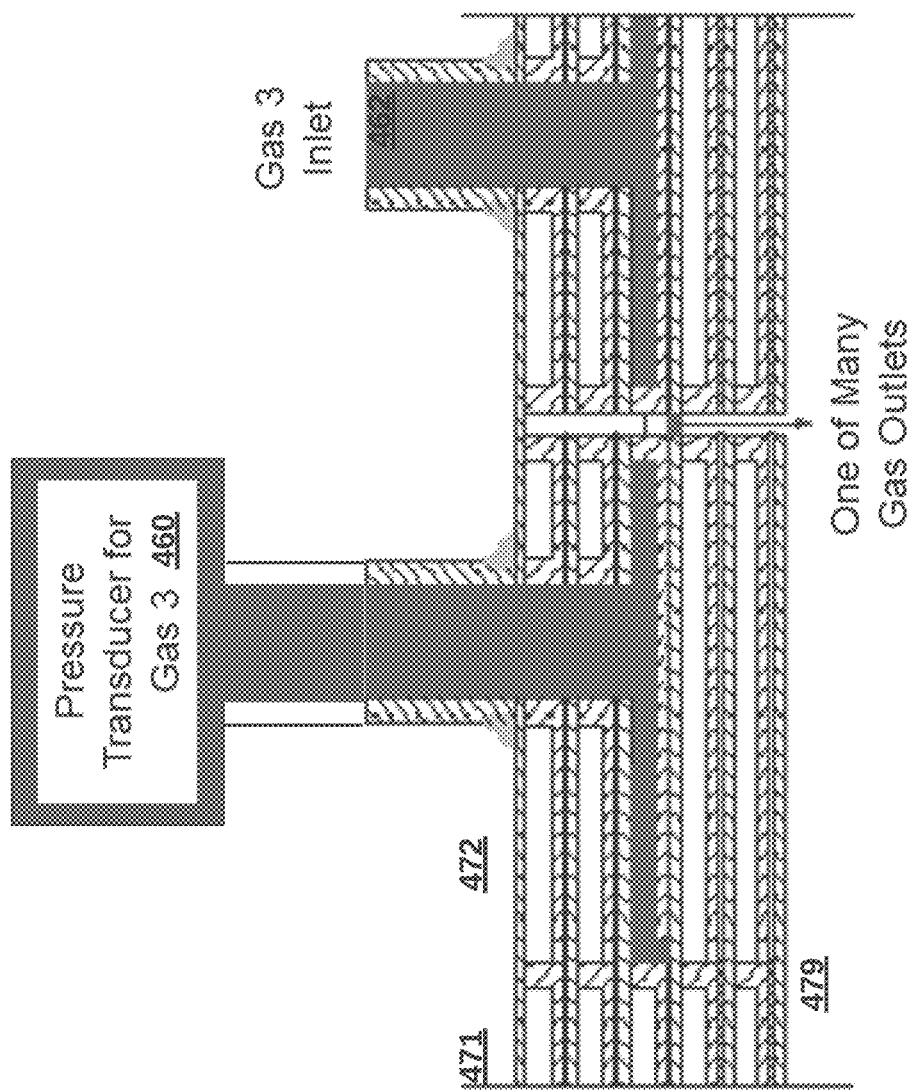

Feed conduits 399 connect to different regions of the gas flow control showerhead 325, and each feeds an isolated plenum section in the showerhead. As shown in FIG. 4B, an inlet 421 of the exemplary gas control showerhead 325 fed from one conduit branch can be internally separated from gas flow paths from other conduit branches (e.g., compare 422c fed by an inlet 421, and 422d not connecting to that inlet 421). Barriers 450 that isolate flow paths from gas inlets (gas 3 in this case) are illustrated from a closer view in FIG. 4D. Configuration and sizing of the different conduits are implementation-specific and can be of varying configurations. Four feed conduits are shown in the configuration of FIG. 3, but one, two, three, or more conduits are also possible in different configurations. Feed conduits 399 can have the same diameter or different diameters (e.g., made from ¼ inch diameter or ⅜ inch diameter tubing), and can be either rigid or flexible.

The chamber 320 houses the gas flow control showerhead 325 and the wafer 326, chamber pressure transducers (not shown) are affixed or adjacent to the chamber 320, while the vacuum pump 327 may be remote or adjacent to the chamber. The chamber 320 can be composed of stainless steel, an aluminum alloy, or other materials suitable for vacuum chambers. The wafer 326 is often spinning under the gas flow control showerhead 325 to aid the effective uniformity of the gas mixture the wafer 326 is exposed to, as the wafer 326 experiences the flow from many outlets of the diffuser disk rather than a single outlet. At certain intervals, such as when a process calls for transition from a first gas or mixture to a second gas or mixture, a variable high capacity valve 329 may be more fully opened to allow the first process gas to be more rapidly evacuated through the vacuum pump 327. Alternatively, the feed conduits 399 maybe have individual valve controlled branches (not shown) which allow the first process gas to be rapidly removed from each individual feed conduit by the vacuum pump 327. In either arrangement, the chamber 320, gas flow control showerhead 325, and feed conduits 399 are quickly cleared of the first process gas in order to continue processing with the second process gas, rather than waiting for displacement by the second process gas.

The exemplary gas flow control showerhead 325 within the chamber 320 receives individual process gases into one or more plenum regions (as further explained below) from conduit branches of the feed conduits 399 and the showerhead 325 outputs gas mixture from multiple outlet holes at different locations numbering over 10, 100, or 1,000, for example. The gas flow control showerhead 325 has several known and characterized flow paths. Thus, MFCs within the gas box are not used because process gas mass flows are determined according to corresponding pressures in the characterized flow paths. The outlet hole output locations are spread in various patterns over a surface of the gas flow control showerhead 325, as shown in FIG. 5D and described below. Generally, the pattern corresponds to different locations of the wafer 326, allowing direct application to those locations. As previously noted, changes of process gas mass flow rate delivered to the wafer 326 may be made very quickly because corresponding e-regulators 311 may adjust the pressure within the internal volume of the feed conduits 399 much more quickly than happens when said internal volumes are fed by mass flow controllers.

Construction of the gas flow control showerhead 325 can be accomplished by multiple manufacturing means including etching of flat sheet metal to form flow passages, channels, and blockages and then stacking the metal sheets (e.g., sheets of FIGS. 5A-5D stacked as shown in FIGS. 4A-4C). The flat pieces of metal may alternatively be referred to as plates depending upon the relative thickness since the pieces of metal used to make the gas flow control showerhead 325 need not be all of identical thickness. Different thicknesses of flat metal may be used to form flow conduits having different characteristic dimensions. The metal sheets and plates can then be diffusion bonded together, mechanically clamped or joined by other means. Additive manufacturing techniques, such as 3D printing of metals, are also contemplated. In other embodiments, the flow control showerhead 325 is composed of ceramic or another appropriate material.

Internal structures of the gas flow control showerhead 325 are now set forth as cross-section views (i.e., FIGS. 4A-4E) and top views through successive layers (i.e., FIGS. 5A-5D). FIGS. 4A-4E are cross-section views illustrating the gas flow control showerhead 325 with integrated flow restrictions of the gas delivery system 300 of FIG. 3, according to an embodiment. For simplicity FIG. 4A shows a partial single restrictor flow path within a gas flow control showerhead 400 to illustrate the concept of restriction. The flow path comprises a first, comparatively large cross section, vertical flow conduit 401 which connects to a plenum region (above and not shown) and conducts gas to a horizontal, comparatively small cross section, flow conduit 402 running parallel to the showerhead face which in turn exhausts to a second, comparatively large cross section, vertical flow conduit 403 that allows the gas to exit the gas flow control showerhead 400. The relative characteristic dimension (e.g., the hydraulic diameter and cross sectional area when the flow path operates as a laminar or molecular flow element), and length determine if a pressure drop created by the flow is significant in conduits 401, 402, 403. The large preponderance of overall pressure drop is designed to occur in the horizontal restrictor conduit 402. In the operation of a high-pressure system such as that used in common pressure based MFC's the pressure drop might be 2000 torr in the restrictor conduit 402 and the characteristic dimension of the flow path may be 0.001" or 0.002" inches with a length of 0.2 to 2.0 inches long. Operation of a low pressure system can have performance advantages and in such system the characteristic dimension might increase to 0.006 inches or larger to reduce the pressure drop across the restrictor conduit 402 to under 500 torr and smaller at anticipated flow rates. This lower operating pressure reduces the gas quantity vented from the upstream volume (e.g. plenum region and feed conduit) to non-process locations when changing gases (multi gas) or when going from a high flow rate to a low flow rate as taught in my earlier inventions.

It may also be appreciated the process gas will generally come close to complete thermal equilibrium with the structure which causes the preponderance of pressure drop, and therefore measuring a temperature of that structure provides a good indication of the gas temperature. Thermocouples, thermistors, and platinum RTDs are all suitable sensors which may be packaged in a manner suited to a vacuum chamber and used to measure the temperature of a gas flow control showerhead 420.

Multiple flow paths shown in FIG. 4B can be incorporated into a gas flow control showerhead 420, allowing multiple gases to flow simultaneously on to a wafer. The large cross section plenum region (appearing as a conduit) 422c receives gas from an inlet conduit 421 and distributes gas to a multitude of comparatively large cross section passages 423. The large cross section plenum region conduit 422c is formed by etching part way through a plate, effectively forming a plenum to distribute gas. If the flow is in the laminar regime, the flow resistance of a flow path is proportional to the 3rd power of the gap between the parallel plates. As such, the flow resistance pressure drop of a passage having a 0.030 inch gap in the large cross section conduit 422 is 1/(30^3)=(1/27,000th) of the pressure drop for a passage of equal length having a 0.001 inch gap in the comparatively small cross section restrictor conduit 424. Other flow regimes (e.g. molecular flow, etc.) are similar, but are not typically as strongly dependent upon gap height as that in the laminar regime.

Portions of etched plates may be formed as thru-holes surrounded by full thickness material. Such plates may be stacked with the thru-holes aligned to make vertical flow conduits coupling among one or more horizontal conduits. This type of structure may be used to combine the outlets from multiple restrictor conduits as shown in FIG. 4C. In some embodiments, multiple different flow paths share a common exhaust 429. In particular, conduits 422a to 422e combine to exhaust through outlet 429. The gases can be the same or different. As discussed above, flow paths can also be separated into regions using etched barrier structures separating the stacked sheets and plates of the gas flow control showerhead 325 in accordance with connecting separated plenum regions to different inlets. For example, inlet conduit 421 feeds large cross section flow path 422c, while large cross section flow path 422d is fed by a different inlet (not shown), and those two large cross section flow paths remain separate and do not connect to each other in the present embodiment.

Figure 5A:
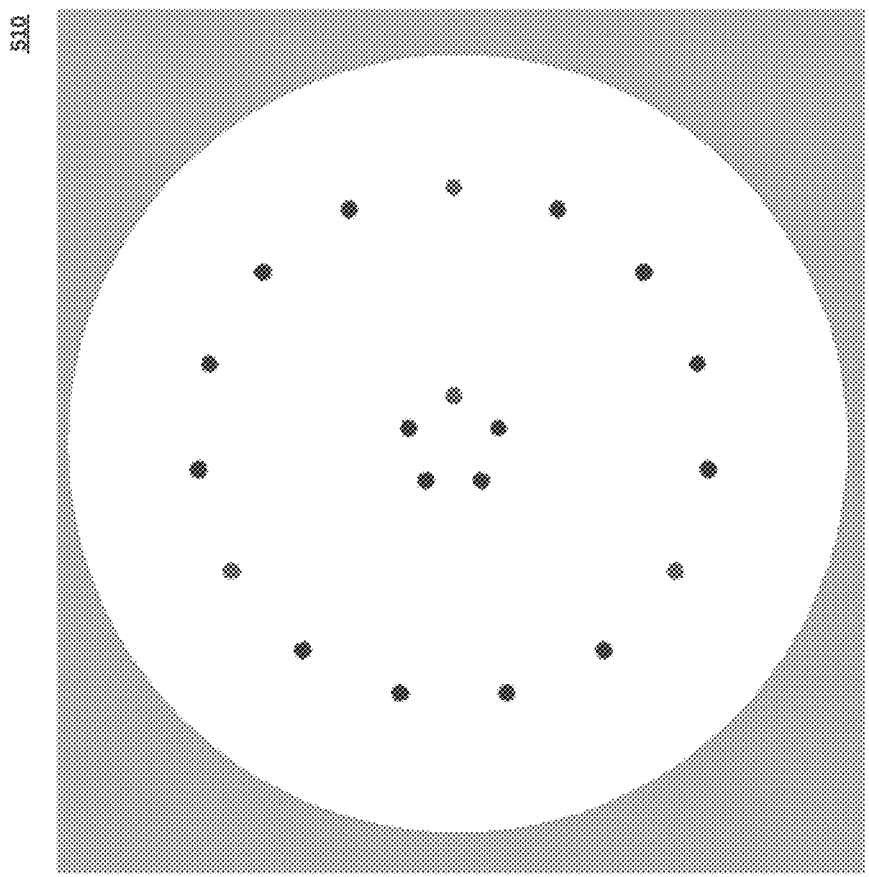
FIGS. 5A-5D are top views illustrating disk layers for the flow control showerhead with integrated flow restrictions of FIG. 3 in more detail, according to some embodiments.
Figure 5B:
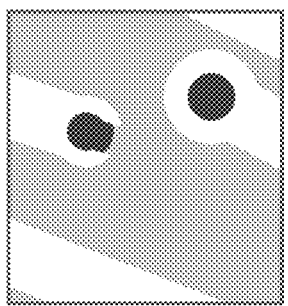
Figure 5B:
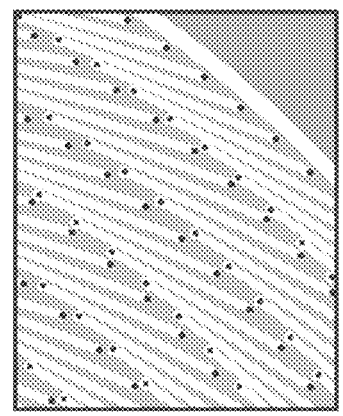
Figure 5B:
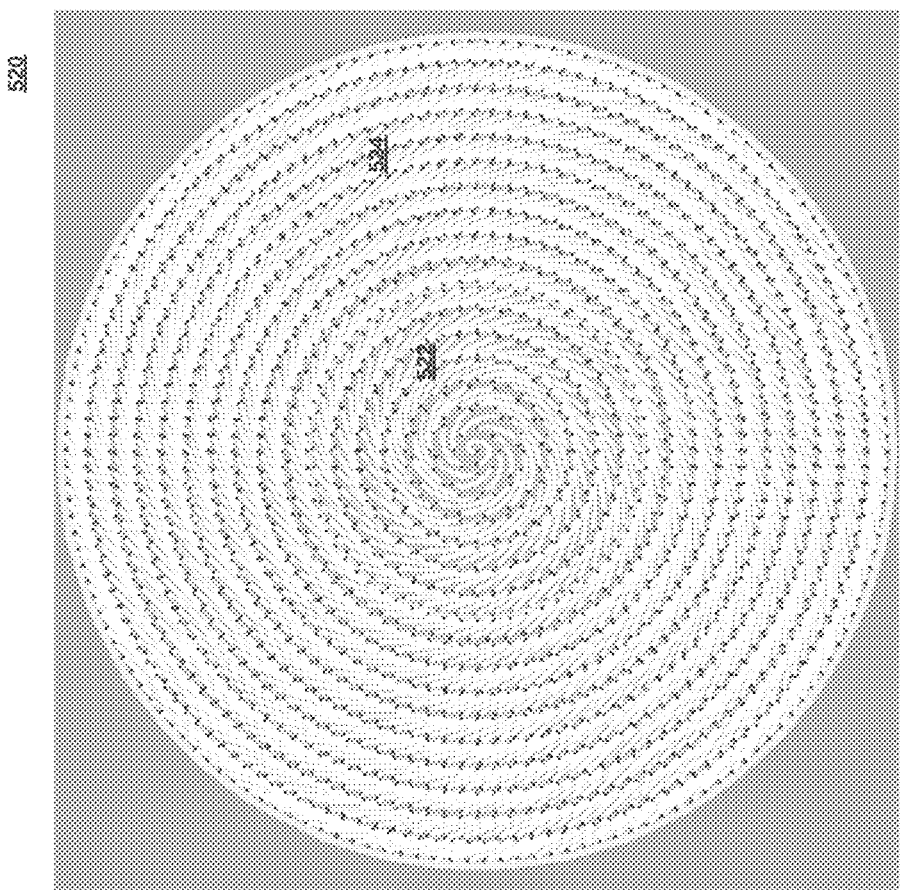
Figure 5C:
Figure 5C:
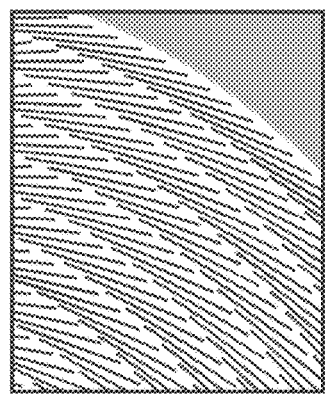
Figure 5C:
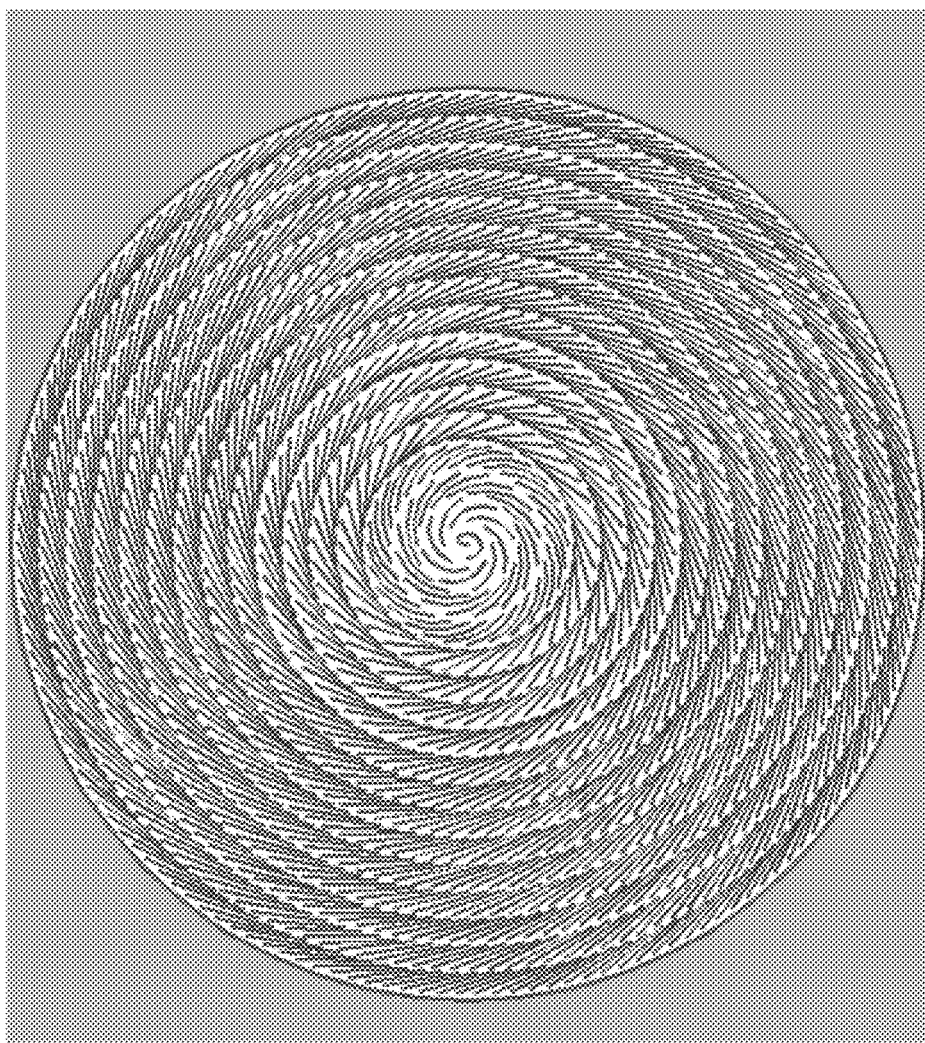
Figure 5D:
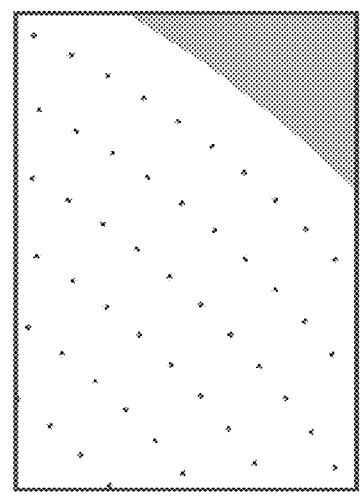
Figure 5D:
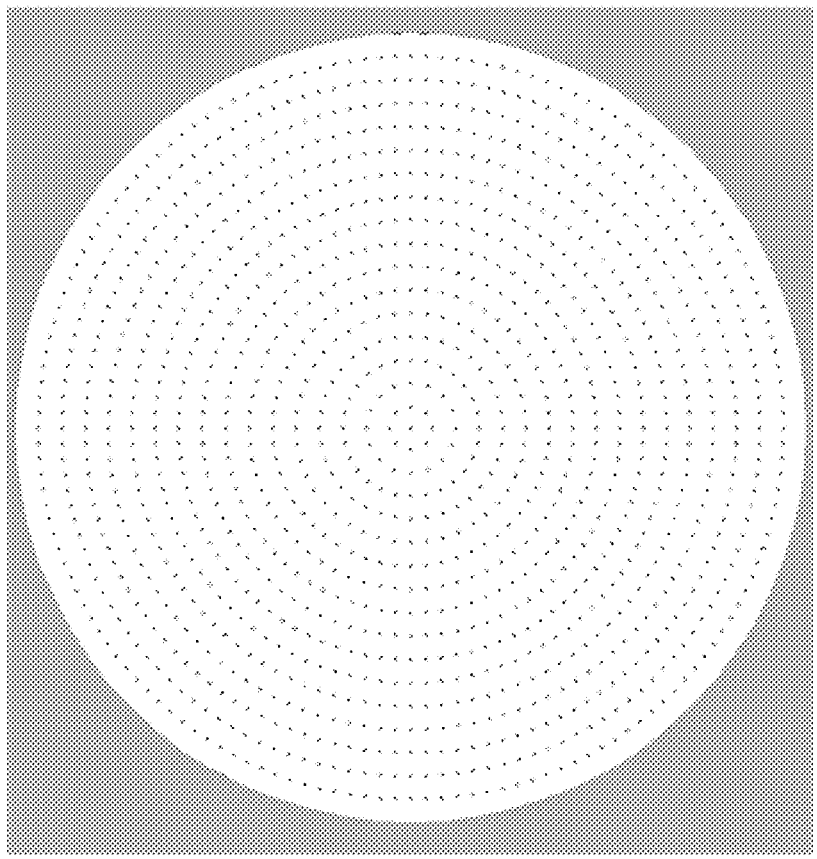

An exemplary set of sheets and plates comprising different etched patterns for making an exemplary gas flow control showerhead are shown in FIGS. 5A-5D, with portions etched through shown in black, portions partially etched shown in gray, and un-etched portions shown in white. Generally, FIG. 5A is a top view illustrating an inlet disk 510 to form the inlet connections from conduits 399 to a gas flow control showerhead (e.g., topmost plate in FIG. 4C), according to an embodiment. A single inlet disk can serve one or more stacks of adjacent disks, described below. FIG. 5B is a top view illustrating a layout for a plenum disk 520 that has thru-holes (shown as solid block), un-etched full thickness features (shown as white), and channels etched into the plate material (shown as gray), according to an embodiment. It may be seen in the FIG. 5B illustration that the channels are locally interconnected and thereby form a plenum region (corresponding to 422a, 422b, 422c, 422d, 422e, in FIG. 4C).

It may also be seen the outer circumference of the plate in FIG. 5B has a rim of full thickness surrounding it entirely. Similarly, contiguous full thickness features may be connected to form a barrier partitioning portions of the plate into separate regions as previously described. A typical partitioning, especially for a showerhead to be used in 300 mm tools, forms a centered circular region and a surrounding ring shaped region. In one embodiment, flow restriction paths are partitioned into an inner region 522 and an outer region 524. Partitioning for a single stack can be accomplished, for instance as in FIG. 4E, by an internal barrier 479 separating region 471 and region 472. Compare to barriers 450 of FIG. 4D which partition between multiple stacks. One embodiment partitions within a single stack, in addition to partioning between adjacent stacks.

FIG. 5C illustrates a layout for a restriction disk 530 with slots etched through the material, according to an embodiment. The sides of each slot form the walls of a comparatively small cross section restrictor flow conduit (corresponding to the restrictor flow conduit 402 in FIG. 4A) running parallel to the showerhead face. In one embodiment, the flow restriction paths are partially etched through the restriction disk 420 with an outlet being fully etched though to exhaust gas.

FIG. 5D illustrates an outlet diffuser disk 540 with thru-holes that each form a portion of a comparatively large cross section outlet flow conduit (corresponding to the outlet flow conduit 403 in FIG. 4A) that allows the gas to exit a gas flow control showerhead, according to an embodiment. In the case of the sheet closest to a wafer (e.g. the bottom most plate in FIG. 4C) these FIG. 5D holes serve as the outlet holes of a gas flow control showerhead. In some embodiments, multiple stacks of disks (each stack including a plenum disk 520, a restriction disk 530, and an outlet diffusion disk 540) are lined up at the outlet holes in order to combine partitioned gases just before exhausting to the wafer 326.

Figure 6:
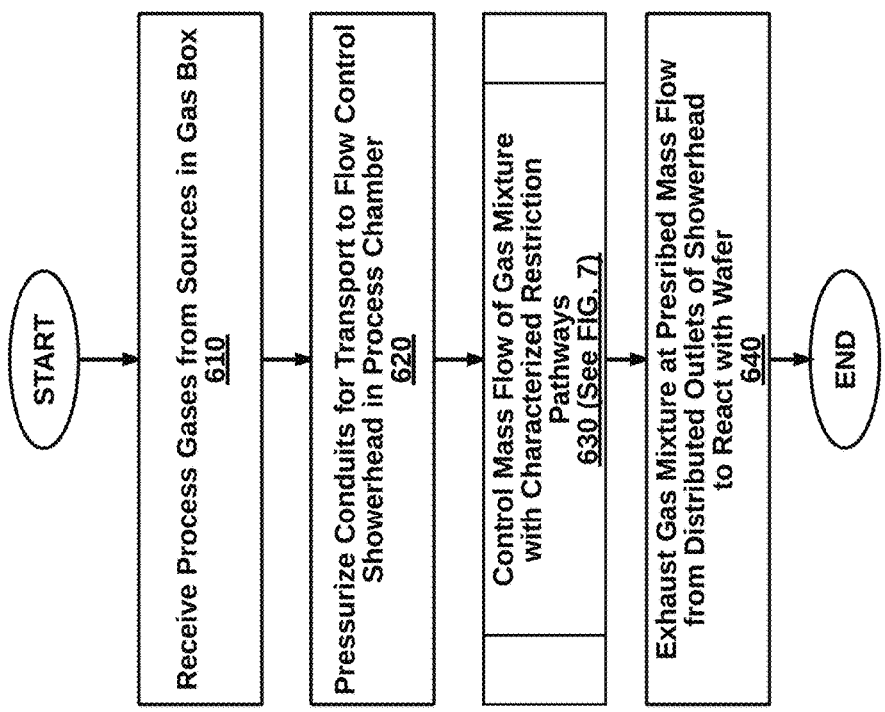
FIG. 6 is a flow chart illustrating a method of gas delivery from a gas flow control showerhead with integrated flow restriction, according to an embodiment.

FIG. 6 is a flow chart illustrating a method of gas delivery from a gas flow control showerhead with integrated flow restriction, according to an embodiment. One or more process gases is received in a gas box (step 610). Selected gases are pressurized in the conduits by, for example, an e-regulator, to a flow control showerhead with integrated flow restriction within process chamber (step 620). A mass flow of each gas is controlled according to each pressure drop across characterized restriction pathways within the flow control showerhead (step 630), as described in more detail with reference to FIG. 7 below. The selected gases combine at a plurality of outlets and the resulting gas mixture exhausts the flow control showerhead through outlet holes distributed around various locations of an outlet diffuser disk to react with a wafer within the process chamber (step 640).

Figure 7:
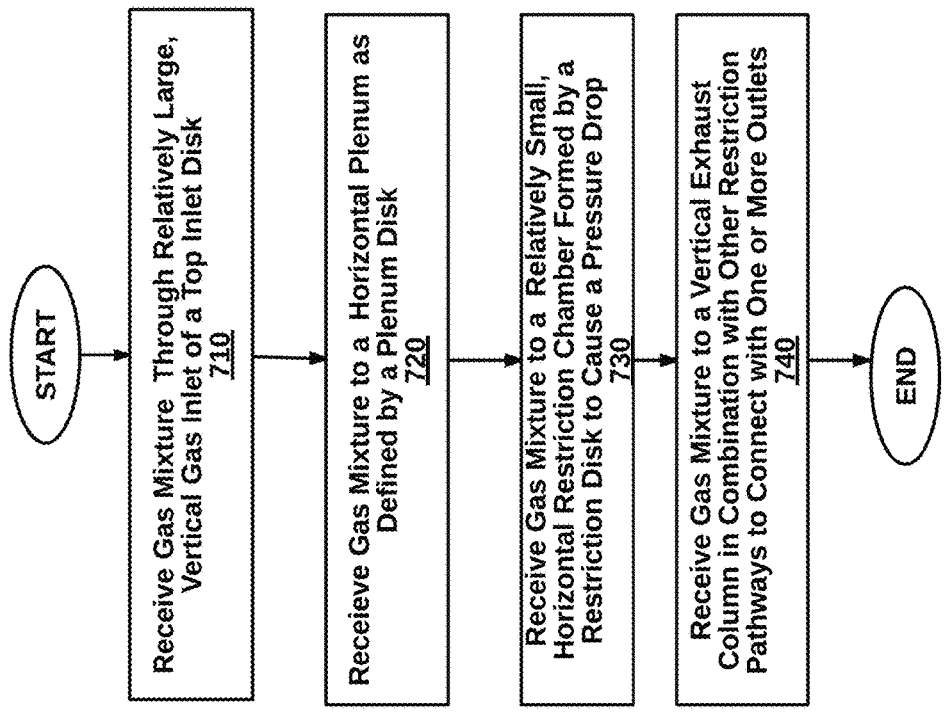
FIG. 7 is a flow chart illustrating the step 630 of mass flow control within the flow control showerhead, according to an embodiment.

FIG. 7 is a flow chart illustrating the step 630 of mass flow control within a flow control showerhead, according to an embodiment. A gas is received through a vertical gas inlet of a top inlet distribution disk at a top layer of the flow control showerhead (step 710). The gas fills a horizontal plenum as defined by a plenum disk stacked below the top inlet distribution disk (step 720). Next, the gas mixture proceeds through a horizontal conduit formed by a restriction disk (step 730). Finally, the gas mixture fills a vertical exhaust column, possibly in combination with other pathways, to reach an outlet hole of an outlet diffuser disk (step 740).

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

We claim:

1. A gas flow control showerhead with multiple integrated characterized restriction flow paths for locally controlling gas delivery to a semiconductor tool, the gas flow control showerhead comprising:
   an inlet distribution disk comprising one or more inlet holes, the inlet holes to fluidly coupled to one or more conduits on an exterior surface to receive one or more process gases;
   an outlet disk comprising a plurality of outlet holes, the outlet holes distributed around different locations of an exterior surface to exhaust the one or more process gases for application to a wafer being processed within a process chamber at a designated mass flow rate; and
   a plurality of flow restriction paths comprising a plenum disk and a restriction disk stacked between the inlet distribution disk and the outlet disk that are combined, the plurality of characterized flow restriction paths in combination with pressure transducers in communication with a plenum area connected to the characterized flow restriction path to control the designated mass flow rate of the one or more process gases by feeding back measurements of the characterized flow restriction path on the gas flow control showerhead to an electronic pressure regulator,
   wherein the plurality of flow restriction paths receives the one or more process gases.

2. The gas flow showerhead of claim 1, wherein a first flow restriction path of the plurality of flow restriction paths comprises a conduit formed from an inlet portion defined by spacing between the inlet distribution disk and a first plenum disk, a plenum portion defined by partial etching of the first plenum disk, a restriction inlet portion defined by thickness of the first plenum disk and a first restriction disk, a restriction portion etched into the first restriction disk, and an outlet portion defined by the first restriction disk and thickness of the outlet disk.

3. The gas flow control showerhead of claim 1, wherein the restriction portion of the first flow restriction path has a characteristic dimension that is small relative to a characteristic dimension of an inlet from the inlet portion and a characteristic dimension of an outlet of the outlet portion, both adjacent portions to the restriction portion, the restriction path characteristic dimension defining a gas flow impedance which generates a pressure drop between the inlet and the outlet which is used to control the designated mass flow rate of the process gas.

4. The gas flow control showerhead of claim 3, wherein the restriction path characteristic dimension is significantly smaller than inlet and outlet characteristic dimensions, to the order of at least a characteristic ratio of one to five.

5. The gas flow control showerhead of claim 4, further comprising:
   a second flow restriction path of the plurality of flow restriction paths having a characteristic ratio that is distinct from the first flow restriction path characteristic ratio.

6. The gas flow control showerhead of claim 1, further comprising:

a second flow restriction path of the plurality of flow restriction paths including an outlet portion, wherein the outlet portion of the second flow restriction path exhausts to an outlet of the outlet disk in common with the outlet portion of the first flow restriction path,
   wherein the second flow restriction path receives a process gas of the one or more process gases.

7. The gas flow control showerhead of claim 6, wherein the process gas received by the first flow restriction path has the same composition as the process gas received by the second flow restriction path.

8. The gas flow control showerhead of claim 6, wherein the process gas received by the first flow restriction path has a different composition as the process gas received by the second flow restriction path.

9. The gas flow control showerhead of claim 1, wherein the first flow restriction path is fluidly coupled to one inlet hole of the one or more inlet holes to receive one of the one or more process gases.

10. The gas flow showerhead of claim 9, wherein the first region is located between a center and a first radius of the gas flow showerhead, and a second region is located between the first radius and an outer radius of the gas flow showerhead.

11. The gas flow control showerhead of claim 1, wherein the inlet distribution disk comprises at least two inlet holes, a first inlet hole receiving a first composition of process gas into a first region and a second inlet hole receiving a second composition of process gas into a second region,
   wherein the first region includes the first restriction path and the second region includes a second restriction path, the first and second regions being separated by barriers in the plenum disk, the restriction disk, and the outlet diffusion disk.

12. The gas flow control showerhead of claim 1, further comprising:
   one or more electronic regulators disposed remote from the gas flow control showerhead and each of the one or more electronic regulators is fluidly coupled to a different end of each of the one of the one or more conduits,
   wherein the one or more electronic regulators supply the process gas according to set points for mass flow rate.

13. The gas flow control showerhead of claim 1, further comprising:
   an electronic regulator disposed remote from the gas control showerhead and fluidly connected to an at least one of the one or more conduits, wherein the electronic regulator pressurizes the at least one of the one or more conduits according to set points for mass flow rate; and
   a pressure transducer probe disposed at the gas flow control showerhead in the first restriction flow path and coupled for feedback to provide pressure measurements for the electronic regulator.

14. The gas flow control showerhead of claim 1, wherein the first flow restriction path of the plurality of flow restriction paths comprises the conduit formed from an inlet portion defined by spacing between the inlet distribution disk and a first plenum disk, a plenum portion of the plenum defined by partial etching of the first plenum disk, a portion defined by thickness of the first plenum disk and the first restriction disk, a restriction portion etched into the first restriction disk, and an outlet portion defined by the first restriction disk and thickness of the outlet diffuser disk.

15. A gas flow control showerhead with multiple integrated characterized restriction flow paths for locally controlling gas delivery to a semiconductor tool, the gas flow control showerhead comprising:

an inlet distribution disk comprising a plurality of inlet holes, a first inlet hole to fluidly couple to one of a plurality of conduits on an exterior surface to receive a first of a plurality of process gases, and a second inlet hole to fluidly couple to one of the plurality of conduits on the exterior surface to receive a second of the plurality of process gases;

a plurality of outlet diffuser disks comprising a plurality of outlet holes, the outlet holes distributed around different locations of an exterior surface to exhaust the plurality of process gases for application to a wafer being processed within a process chamber at a designated mass flow rate; and a plurality of flow restriction paths comprising a plurality of grouped triplets of plenum disks, restriction disks, and outlet diffuser disks stacked adjacent to the inlet distribution disk with outlet holes of the outlet disks aligned to combine the first and second of the plurality of gases, the plurality of characterized flow restriction paths in combination with pressure transducers in communication with a plenum area connected to the characterized flow restriction path to control the designated mass flow rate of the one or more process gases by feeding back measurements of the characterized flow restriction path on the gas flow control showerhead to an electronic pressure regulator.

16. The gas flow control showerhead of claim 15 further comprising at least one temperature sensing element in thermal contact with at least one of a plenum disk or an outlet disk.

17. The gas flow control showerhead of claim 15, further comprising:
at least one fluid conduit, fluidly coupled to an adjacent pressure transducer, wherein the at least one fluid conduit is distinct from a gas feed conduit.

18. The gas flow control showerhead of claim 15, wherein at least one pressure transducer is fluidly coupled to a gas feed conduit adjacent to the showerhead.

19. A gas flow control showerhead with multiple integrated characterized restriction flow paths for locally controlling gas delivery to a semiconductor tool, the gas flow control showerhead comprising:

an inlet distribution disk comprising one or more inlet holes, the inlet holes fluidly coupled to one or more conduits on an exterior surface to receive one or more process gases; and a plurality of flow restriction paths comprising a plenum disk stacked next to the inlet distribution disk and a restriction disk, the plurality of characterized flow restriction paths in combination with pressure transducers in communication with a plenum area connected to the characterized flow restriction path to control the designated mass flow rate of the one or more process gases by feeding back measurements of the characterized flow restriction path on the gas flow control showerhead to an electronic pressure regulator, wherein a first flow restriction path of the plurality of flow restriction paths comprises a conduit formed from an inlet portion defined by spacing between the inlet distribution disk and a first plenum disk, a plenum portion defined by partial etching of the first plenum disk, a restriction inlet portion defined by thickness of the first plenum disk and a first restriction disk, a restriction portion partially etched into the first restriction disk, and an outlet portion defined by a thickness of the first restriction disk beyond the partial etching, wherein the restriction disk comprises a plurality of outlet holes distributed around locations of an exterior surface to exhaust the one or more process gases for application to a wafer being processed within a process chamber at a designated mass flow rate, and wherein the first flow restriction path receives a process gas of the one or more process gasses.

* * * * *